(12) United States Patent
Kijima et al.

(10) Patent No.: US 8,877,520 B2
(45) Date of Patent: Nov. 4, 2014

(54) FERROELECTRIC FILM CONTAINING A PEROVSKITE STRUCTURE OXIDE AND METHOD FOR MANUFACTURING A FERROELECTRIC FILM

(71) Applicant: Youtec Co., Ltd., Chiba (JP)

(72) Inventors: Takeshi Kijima, Chiba (JP); Yuuji Honda, Chiba (JP); Haruhito Hayakawa, Chiba (JP); Takekazu Shigenai, Chiba (JP)

(73) Assignee: Youtec Co., Ltd, Chiba (JP)

( * ) Notice: Subject to any disclaimer, the term of this patent is extended or adjusted under 35 U.S.C. 154(b) by 0 days.

(21) Appl. No.: 13/749,770

(22) Filed: Jan. 25, 2013

(65) Prior Publication Data

US 2013/0192878 A1    Aug. 1, 2013

(30) Foreign Application Priority Data

Jan. 27, 2012    (JP) .................................. 2012-15597

(51) Int. Cl.
| | |
|---|---|
| *H01L 21/00* | (2006.01) |
| *H01L 41/187* | (2006.01) |
| *H01L 41/319* | (2013.01) |
| *H01L 41/39* | (2013.01) |
| *H01L 41/318* | (2013.01) |

(52) U.S. Cl.
CPC ............ *H01L 41/39* (2013.01); *H01L 41/1876* (2013.01); *H01L 41/319* (2013.01); *H01L 41/1873* (2013.01); *H01L 41/318* (2013.01)

USPC .................. 438/3; 174/250; 427/58; 427/122; 427/126.3

(58) Field of Classification Search
CPC .............................. H01L 41/187; H01L 41/39
USPC ............... 438/3; 174/250; 427/58, 122, 126.3
See application file for complete search history.

(56) References Cited

U.S. PATENT DOCUMENTS

| | | | |
|---|---|---|---|
| 7,960,901 B2 * | 6/2011 | Natori et al. .................... 310/358 |
| 2005/0019493 A1 * | 1/2005 | Basceri et al. ............ 427/255.28 |
| 2009/0230821 A1 * | 9/2009 | Natori et al. .................... 310/358 |
| 2010/0207492 A1 * | 8/2010 | Natori et al. .................... 310/365 |
| 2010/0289384 A1 * | 11/2010 | Natori et al. .................... 310/367 |
| 2011/0275163 A1 * | 11/2011 | Ahn et al. ........................... 438/3 |
| 2012/0295099 A1 * | 11/2012 | Watanabe et al. ............. 428/336 |

FOREIGN PATENT DOCUMENTS

| | | | |
|---|---|---|---|
| JP | 2011-029399 | * | 7/2009 |
| WO | 2006/087777 | | 8/2006 |

* cited by examiner

*Primary Examiner* — Caleb Henry
(74) *Attorney, Agent, or Firm* — Wenderoth, Lind & Ponack, L.L.P.

(57) ABSTRACT

A method for manufacturing a ferroelectric film including the steps of forming a burnable material film containing hydrogen of not less than 1% by weight on a substrate; forming an amorphous thin film including a ferroelectric material on the burnable material film; and oxidizing and crystallizing the amorphous thin film while supplying hydrogen to the amorphous thin film by burning the burnable material film through heating of the burnable material film and the amorphous thin film in an oxygen atmosphere, to thereby form a first ferroelectric film on the substrate.

21 Claims, 5 Drawing Sheets

(001)PZT

(110)PZT

FERROELECTRIC FILM CONTAINING A PEROVSKITE STRUCTURE OXIDE AND METHOD FOR MANUFACTURING A FERROELECTRIC FILM

BACKGROUND OF THE INVENTION

1. Field of the Invention

The present invention relates to a technology of changing and controlling arbitrarily the orientation of a ferroelectric film to be crystallized.

2. Description of a Related Art

A conventional method for manufacturing $Pb(Zr,Ti)O_3$ (hereinafter, referred to as "PZT") perovskite-type ferroelectric ceramics will be described.

On a 4-inch Si wafer, a $SiO_2$ film having a thickness of 300 nm is formed, and, on the $SiO_2$ film, a $TiO_x$ film having a thickness of 5 nm is formed. Next, on the $TiO_x$ film, a Pt film having a thickness of 150 nm oriented, for example, in (111) is formed, and, on the Pt film, a PZT sol-gel solution is spin-coated with a spin coater. The spin condition at this time is such that the wafer is rotated for 30 seconds at a rotation rate of 1500 rpm and for 10 seconds at a rotation rate of 4000 rpm.

Next, the coated PZT sol-gel solution is heated and held on a hot plate at 250° C. for 30 seconds to be dried and the moisture was eliminated, and, after that, in addition, the solution is heated and held for 60 seconds on a hot plate kept at high temperature of 500° C., and thus temporary calcinations is performed. By repetition of these a plurality of times, a PZT amorphous thin film having a thickness of 150 nm is produced.

Subsequently, annealing treatment was performed on the PZT amorphous thin film by using a pressurizing-type lamp annealing apparatus (RTA: rapidly thermal anneal), to crystallize the PZT. The crystallization annealing at this time was performed under conditions in which the thin film was heated up to 700° C. at a temperature increase rate of 100° C./sec and held for 1 min, at respective oxygen partial pressures of 1 atm, 5 atm and 10 atm. The PZT film thus crystallized is composed of a perovskite structure (see, for example, Patent Document 1 (WO 2006/087777)).

PZT films crystallized at each of oxygen partial pressures of the above-described 1 atm, 5 atm and 10 atm were evaluated by X-ray diffraction (hereinafter, represented as "XRD") measurement. As a result, even by simply changing the oxygen partial pressure, no change occurred in the orientation of the PZT film crystal, which did not allow control of the orientation of the PZT film.

FIG. 8 is a drawing showing an XRD pattern of the PZT film crystallized at an oxygen partial pressure of the above-described 10 atm, in which the vertical axis shows an XRD reflection intensity and the horizontal axis shows a rotation angle 2θ. From FIG. 8, it is known that the PZT film is crystallized, but in the industrial world, a ferroelectric material film having further higher crystallinity is required.

SUMMARY OF THE INVENTION

Problems to be Solved by the Invention

An aspect of the present invention aims at further accelerating the crystallization of a ferroelectric film. Furthermore, an aspect of the present invention aims at further improving the crystallinity of a ferroelectric film. Moreover, an aspect of the present invention aims at arbitrarily controlling the orientation of a ferroelectric film to be crystallized.

Hereinafter, various aspects of the present invention will be described.

(1) A method for manufacturing a ferroelectric film, including the steps of:

forming a burnable material film containing hydrogen of not less than 1% by weight (preferably not less than 10% by weight) on a substrate;

forming an amorphous thin film including a ferroelectric material on the burnable material film; and oxidizing and crystallizing the amorphous thin film while supplying hydrogen to the amorphous thin film by burning the burnable material film through heating of the burnable material film and the amorphous thin film in an oxygen atmosphere, to thereby form a first ferroelectric film on the substrate.

(2) The method for manufacturing a ferroelectric film according to the above-described (1), wherein the burnable material film is a $C_xN_yH_z$ film, a carbon film or a DLC film, and x, y and z satisfy following Formulae (i) and (ii):

$$0.1 \leq z \tag{i}$$

$$x+y+z=1 \tag{ii}$$

(3) A method for manufacturing a ferroelectric film, including the steps of:

forming, on a substrate, an amorphous thin film including a burnable material containing hydrogen of not less than 1% by weight (preferably not less than 10% by weight) and a ferroelectric material; and oxidizing and crystallizing the amorphous thin film while supplying hydrogen to the amorphous thin film by burning the burnable material through heating of the amorphous thin film in an oxygen atmosphere, to thereby form a first ferroelectric film on the substrate.

(4) The method for manufacturing a ferroelectric film according to the above-described (3), wherein the burnable material is a carbon powder that supports hydrogen.

(5) The method for manufacturing a ferroelectric film according to any one of the above-described (1) to (4), wherein the first ferroelectric film includes at least one of:

perovskite or a bismuth layered structure oxide represented by $ABO_3$ or $(Bi_2O_2)^{2+}(A_{m-1}B_mO_{3m+1})^{2-}$ (where, A is at least one kind selected from the group consisting of Li, Na, K, Rb, Pb, Ca, Sr, Ba, Bi, La and Hf, B is at least one kind selected from the group consisting of Ru, Fe, Ti, Zr, Nb, Ta, V, W and Mo, and m is a natural number of not more than 5);

a superconductive oxide represented by $LanBa_2Cu_3O_7$, $Trm_2Ba_2Ca_{n-1}Cu_nO_{2n+4}$ or $TrmBa_2Ca_{n-1}Cu_nO_{2n+3}$ (where, Lan is at least one kind selected from the group consisting of Y, La, Ce, Pr, Nd, Pm, Sm, Eu, Gd, Tb, Dy, Ho, Er, Tm, Yb and Lu, Trm is at least one kind selected from the group consisting of Bi, Tl and Hg, and n is a natural number of not more than 5);

a tungsten bronze structure oxide represented by $A_{0.5}BO_3$ (tetragonal bronze structure) or $A_{0.3}BO_3$ (hexagonal bronze structure) (where, A is at least one kind selected from the group consisting of Li, Na, K, Rb, Cs, Pb, Ca, Sr, Ba, Bi and La, and B is at least one kind selected from the group consisting of Ru, Fe, Ti, Zr, Nb, Ta, V, W and Mo);

a material of at least one kind selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$;

a material including $SiO_2$ in the at least one kind of material; and a material including $SiO_2$ and $GeO_2$ in the at least one kind of material.

(6) The method for manufacturing a ferroelectric film according to any one of the above-described (1) to (5), wherein:

the first ferroelectric film includes a perovskite structure oxide; and the first ferroelectric film is oriented in any of (001), (001)+ (110), (110), (110)+(111), and (111), when the amorphous thin film is heated in an oxygen atmosphere, by increase in an oxygen supply amount, as a pressurized oxygen atmosphere.

(7) The method for manufacturing a ferroelectric film according to the above-described (6), wherein:

a pressure of the pressurized oxygen atmosphere when the first ferroelectric film is oriented in (001) is lower than a pressure of the pressurized oxygen atmosphere when the first ferroelectric film is oriented in (001)+(110);

a pressure of the pressurized oxygen atmosphere when the first ferroelectric film is oriented in (001)+(110) is lower than a pressure of the pressurized oxygen atmosphere when the first ferroelectric film is oriented in (110);

a pressure of the pressurized oxygen atmosphere when the first ferroelectric film is oriented in (110) is lower than a pressure of the pressurized oxygen atmosphere when the first ferroelectric film is oriented in (110)+(111); and a pressure of the pressurized oxygen atmosphere when the first ferroelectric film is oriented in (110)+(111) is lower than a pressure of the pressurized oxygen atmosphere when the first ferroelectric film is oriented in (111).

(8) The method for manufacturing a ferroelectric film according to any one of the above-described (1) to (5), wherein:

the first ferroelectric film includes a perovskite structure oxide; and the first ferroelectric film is oriented in any of (001), (001)+ (110), (110), (110)+(111) and (111) by increasing a thickness of the burnable material film.

(9) The method for manufacturing a ferroelectric film according to the above-described (8), wherein:

a thickness of the burnable material film when the first ferroelectric film is oriented in (001) is smaller than a thickness of the burnable material film when the first ferroelectric film is oriented in (001)+(110);

a thickness of the burnable material film when the first ferroelectric film is oriented in (001)+(110) is smaller than a thickness of the burnable material film when the first ferroelectric film is oriented in (110);

a thickness of the burnable material film when the first ferroelectric film is oriented in (110) is smaller than a thickness of the burnable material film when the first ferroelectric film is oriented in (110)+(111); and a thickness of the burnable material film when the first ferroelectric film is oriented in (110)+(111) is smaller than a thickness of the burnable material film when the first ferroelectric film is oriented in (111).

(10) The method for manufacturing a ferroelectric film according to the above-described (8) or (9), wherein the burnable material film is a DLC film having a thickness of 0.1 nm to 300 nm.

(11) The method for manufacturing a ferroelectric film according to any one of the above-described (6) to (10), wherein the first ferroelectric film is a PZT film.

(12) The method for manufacturing a ferroelectric film according to any one of the above-described (1) to (11), wherein:

an electrode is formed on the substrate; and the first ferroelectric film is formed on the electrode.

(13) The method for manufacturing a ferroelectric film according to any one of the above-described (1) to (12), wherein a thickness of the amorphous thin film is 5 nm to 450 nm.

(14) The method for manufacturing a ferroelectric film according to any one of the above-described (6) to (11), furthermore comprising, after the step of forming the first ferroelectric film on a substrate, the step of forming an amorphous thin film including a ferroelectric material on the first ferroelectric film, and oxidizing and crystallizing the amorphous thin film by heating the amorphous thin film in an oxygen atmosphere, to thereby form a second ferroelectric film on the first ferroelectric film.

(15) A ferroelectric film comprising a perovskite structure oxide, wherein a half-value width of the strongest peak in measurement results of any of (001), (110) and (111) orientations by X-ray diffraction is not more than 1.5° (preferably not more than 0.75°, more preferably not more than 0.4°).

(16) The ferroelectric film according to the above-described (15), wherein it is manufactured by the method for manufacturing a ferroelectric film according to any one of the above-described (6) to (11).

(17) An electronic component using the ferroelectric film according to the above-described (15) or (16).

By applying an aspect of the present invention, the crystallization of a ferroelectric material film can be further accelerated. Furthermore, by applying an aspect of the present invention, the crystallinity of a ferroelectric material film can be further improved. Moreover, by applying an aspect of the present invention, the orientation of a ferroelectric film to be crystallized can be arbitrarily controlled.

DESCRIPTION OF THE PREFERRED EMBODIMENTS

Figure 1:
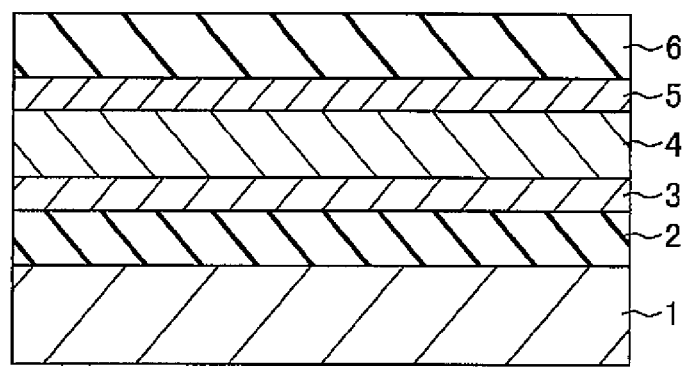
FIG. 1 is a cross-sectional view for describing the method for manufacturing the PZT film according to Example 1 of the present invention.

Hereinafter, embodiments and examples of the present invention will be described in detail using the drawings. However, a person skilled in the art understands easily that the present invention is not limited to the description below, but various modifications of forms and details thereof are possible without deviating from the gist and scope of the invention. Accordingly, the present invention should not be construed as limited to the description of embodiments and Examples shown below.

First Embodiment

A method for manufacturing a ferroelectric film according to an aspect of the present invention will be described.

On a substrate, an electrode is formed. As the electrode, a Pt film oriented in a prescribed crystalline plane, for example, in (111) is used. Note that, in the present embodiment, a Pt film is used as the electrode, but various ones may be used as long as they function as an electrode. For example, such a material as Au, Ag, Pa or Ir may be used.

Subsequently, on the electrode, a burnable material film containing hydrogen of not less than 1% by weight (preferably not less than 10% by weight, more preferably to 80% by weight, further preferably 30 to 60% by weight) is formed. The burnable material film is a film to be burned and disappearing in a later crystallization process heated in an oxygen atmosphere, and is a film that discharges hydrogen contained in the film in the burning.

As the burnable material film, a $C_xN_yH_z$ film, a carbon film or a diamond-like carbon film (hereinafter referred to as "a DLC film") formed, for example, by a CVD method may be used. x, y and z satisfy Formulae (i) and (ii), preferably (i') to (iv') below.

$$0.1 \leq z \quad (i)$$

$$x+y+z=1 \quad (ii)$$

$$0<x \quad (i')$$

$$0<y \quad (ii')$$

$$0.1 \leq z \quad (iii')$$

$$x+y+z=1 \quad (iv')$$

As the $C_xN_yH_z$ film, for example, any of $C_4H_2N_2$, $C_5H_3N_3$, $C_7H_3N_3$, $C_6H_2N_4$, $C_5H_2N_4$, $C_{10}H_2N_4$, $C_{12}H_4N_4$ and $C_6N_4$ may be used. When the $C_xN_yH_z$ film is used as the burnable material film, hydrogen and nitrogen contained in the film is discharged in the burning in the later crystallization process of the heating in an oxygen atmosphere.

Furthermore, when a DLC film is used as the burnable material film, the thickness thereof may be, for example, 0.1 nm to 300 nm.

Next, on the burnable material film, a first amorphous thin film including a first ferroelectric material is formed. The thickness of the first amorphous thin film may be 5 to 450 nm (preferably 20 to 150 nm). The first ferroelectric material is a material to be a film composed of any of (1) to (6) below by the crystallization of the first amorphous thin film in a later crystallization process.

(1) Perovskite and bismuth layered structure oxides represented by $ABO_3$ or $(Bi_2O_2)^{2+}(A_{m-1}B_mO_{3m+1})^{2-}$ (where, A is at least one kind selected from the group consisting of Li, Na, K, Rb, Pb, Ca, Sr, Ba, Bi, La and Hf, B is at least one kind selected from the group consisting of Ru, Fe, Ti, Zr, Nb, Ta, V, W and Mo, and m is a natural number of not more than 5).

(2) Superconductive oxides represented by $LanBa_2Cu_3O_7$, $Trm_2Ba_2Ca_{n-1}Cu_nO_{2n+4}$ or $TrmBa_2Ca_{n-1}Cu_nO_{2n+3}$ (where, Lan is at least one kind selected from the group consisting of Y, La, Ce, Pr, Nd, Pm, Sm, Eu, Gd, Tb, Dy, Ho, Er, Tm, Yb and Lu, Trm is at least one kind selected from the group consisting of Bi, Tl and Hg, and n is a natural number of not more than 5).

(3) Tungsten bronze structure oxides represented by $A_{0.5}BO_3$ (tetragonal bronze structure) or $A_{0.3}BO_3$ (hexagonal bronze structure) (where, A is at least one kind selected from the group consisting of Li, Na, K, Rb, Cs, Pb, Ca, Sr, Ba, Bi and La, and B is at least one kind selected from the group consisting of Ru, Fe, Ti, Zr, Nb, Ta, V, W and Mo).

(4) A material of at least one kind selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$.

(5) A material including $SiO_2$ in the above-mentioned at least one kind of material.

(6) A material including $SiO_2$ and $GeO_2$ in the above-mentioned at least one kind of material.

Next, by heating the burnable material film and the first amorphous thin film in an oxygen atmosphere, the burnable material film is burned, and at this time, hydrogen is discharged, and, while the hydrogen is supplied to the first amorphous thin film, the first amorphous thin film is oxidized and crystallized. Consequently, on the electrode, the first ferroelectric film is formed. The crystallization is caused by oxidation of the first amorphous thin film with oxygen along with the reduction of the film with hydrogen. The oxidization along with the reduction with hydrogen means that alkali metals such as Li, Na, K and Rb in the first amorphous thin film are reduced to be kept as pure alkali metals and the pure alkali metals are oxidized with oxygen. That is, the utilization of reduction action with hydrogen makes it possible to further accelerate the oxidation of the alkali metal for crystallization. As the result, the crystallization of the first amorphous thin film can be further accelerated, and the crystallinity of the first ferroelectric film can be further improved.

When the first ferroelectric film is composed of a perovskite structure oxide, in heating the first amorphous thin film in an oxygen atmosphere, a pressurized oxygen atmosphere may be utilized to increase the oxygen supply amount. Consequently, the first ferroelectric film is oriented in any of (001), (001)+(110), (110), (110)+(111) and (111).

For more information, the pressure of a pressurized oxygen atmosphere when the first ferroelectric film is oriented in (001) is lower than that of a pressurized oxygen atmosphere when the first ferroelectric film is oriented in (001)+(110). Furthermore, the pressure of a pressurized oxygen atmosphere when the first ferroelectric film is oriented in (001)+(110) is lower than that of a pressurized oxygen atmosphere when the first ferroelectric film is oriented in (110). Moreover, the pressure of a pressurized oxygen atmosphere when the first ferroelectric film is oriented in (110) is lower than that of a pressurized oxygen atmosphere when the first ferroelectric film is oriented in (110)+(111). In addition, the pressure of a pressurized oxygen atmosphere when the first ferroelectric film is oriented in (110)+(111) is lower than that of a pressurized oxygen atmosphere when the first ferroelectric film is oriented in (111). As described above, depending on the oxygen partial pressure, the orientation of the crystalline plane of the first ferroelectric film can be controlled.

Furthermore, when the first ferroelectric film is composed of a perovskite structure oxide, by increasing the thickness of the burnable material film, the first ferroelectric film is oriented in any of (001), (001)+(110), (110), (110)+(111), and (111).

For more information, the thickness of a burnable material film when the first ferroelectric film is oriented in (001) is smaller than that of a burnable material film when the first ferroelectric film is oriented in (001)+(110). Furthermore, the thickness of a burnable material film when the first ferroelectric film is oriented in (001)+(110) is smaller than that of a burnable material film when the first ferroelectric film is oriented in (110). Moreover, the thickness of a burnable material film when the first ferroelectric film is oriented in (110) is smaller than that of a burnable material film when the first ferroelectric film is oriented in (110)+(111). In addition, the thickness of a burnable material film when the first ferroelectric film is oriented in (110)+(111) is smaller than that of a burnable material film when the first ferroelectric film is oriented in (111). As described above, depending on the thickness of the burnable material film, the orientation of the crystalline plane of the first ferroelectric film can be controlled.

Moreover, when the first ferroelectric film is a PZT film, the PZT film is oriented, for example, in any of (001), (001)+(110), and (110).

For more information, when the burnable material film is, for example, a DLC film having a thickness of 10 µm and the first ferroelectric film is, for example, a PZT film having a thickness of 2 to 4 µm, the PZT film is oriented in (001). Furthermore, when the burnable material film is, for example, a DLC film having a thickness of 20 µm and the first ferroelectric film is, for example, a PZT film having a thickness of 2 to 4 µm, the PZT film is oriented in (001)+(110), in which (001) is stronger in orientation intensity. Moreover, when the burnable material film is, for example, a DLC film having a thickness of 50 µm and the first ferroelectric film is, for example, a PZT film having a thickness of 2 to 4 µm, the PZT film is oriented in (110)+(001), in which (110) is stronger in orientation intensity. In addition, when the burnable material film is, for example, a DLC film having a thickness of 100 µm and the first ferroelectric film is, for example, a PZT film having a thickness of 2 to 4 µm, the PZT film is oriented in (110)+(001), in which (110) is considerably stronger in orientation intensity.

The first ferroelectric film produced as described above is used as an initial nucleus to form a second amorphous thin film containing a second ferroelectric material on the first ferroelectric film. The thickness of the second amorphous thin film may be thicker than that of the first amorphous thin film. As the second ferroelectric material, the material that is the same as the first ferroelectric material may be used.

Next, by heating the second amorphous thin film in an ordinary pressure or pressurized oxygen atmosphere, the second amorphous thin film is oxidized and crystallized. Consequently, on the first ferroelectric film, a second ferroelectric film is formed. Since the first ferroelectric film is used as an initial nucleus in the crystallization, the second ferroelectric film has the same orientation of crystalline plane as that of the first ferroelectric film.

The crystallinity of each of the first and second ferroelectric films produced as described above can be further improved. In addition, by using the first ferroelectric film or the first and second ferroelectric films, an electronic component may be produced.

Second Embodiment

A method for manufacturing a ferroelectric film according to an aspect of the present invention will be described.

The present embodiment is the same as the first embodiment except for the following point.

Instead of a process, in the first embodiment, of forming, on the electrode, the burnable material film containing hydrogen of not less than 1% by weight and forming, on the burnable material film, the first amorphous thin film including the first ferroelectric material, in the present embodiment, there is used a process of forming, on an electrode, a first amorphous thin film including a burnable material containing hydrogen of not less than 1% by weight (preferably not less than 10% by weight, more preferably to 80% by weight, further more preferably 30 to 60% by weight) and the first ferroelectric material.

After forming the above-described first amorphous thin film, heating was performed on the first amorphous thin film in an oxygen atmosphere to burn the burnable material in the first amorphous thin film and cause the burnable material to disappear. At this time, hydrogen is discharged and, while the hydrogen is supplied to the first amorphous thin film, the first amorphous thin film is oxidized and crystallized. Consequently, on the electrode, the first ferroelectric film is formed. The role of the hydrogen in the crystallization is the same as that in the first embodiment, and thus, by utilizing the reduction action of hydrogen, the oxidation for crystallization can be further accelerated. As the result, the crystallization of the first amorphous thin film can be further accelerated, and the crystallinity of the first ferroelectric film can be further improved.

As the burnable material, carbon powder that supports hydrogen can be used. As a method for supporting hydrogen, for example, hydrogen can be supported easily by immersing porous carbon powder in acetone.

Furthermore, as another usable burnable material, there can be used carbon powder covered with a $C_xN_yH_z$ film or a DLC film containing hydrogen, by a CVD method or a sputtering method. Note that the same $C_xN_yH_z$ film as that in the first embodiment can be used.

Example 1

FIG. 1 is a cross-sectional view for describing the method for manufacturing the PZT film according to Example 1 of the present invention.

The manufacturing method of the PZT film is a manufacturing method of a PZT film on a substrate, which is a manufacturing method of a ferroelectric ceramic thin film by using a carbon film such as a DLC film as the burnable material film.

First, four substrates for producing samples 1 to 4 were prepared. As the substrate, there was used one having a 200 nm-thick $SiO_2$ film 2 formed on a 6-inch Si substrate 1, having a 30 nm-thick $TiO_x$ film 3 formed on the $SiO_2$ film 2 and a (111)-oriented 200 nm-thick Pt electrode thin film 4 formed on the $TiO_x$ film 3.

Subsequently, on the Pt electrode thin film 4 of the substrate of the sample 1, a 10 nm-thick DLC film, which is a carbon film 5 as a burnable material film, was formed. Furthermore, on the Pt electrode thin film 4 of the substrate of the sample 2, a 20 nm-thick DLC film, which is the carbon film 5 as the burnable material film, was formed. Moreover, on the Pt electrode thin film 4 of the substrate of the sample 3, a 50 nm-thick DLC film, which is the carbon film 5 as the burnable material film, was formed. In addition, on the Pt electrode thin film 4 of the substrate of the sample 4, a 100 nm-thick DLC film, which is the carbon film 5 as the burnable material film, was formed. These DLC films contained 25% of hydrogen. Methods for forming these DLC films are as follows.

[Method for Forming DLC Film of Sample 1]

A 10 nm-thick DLC film was formed on the Pt electrode thin film 4 of the substrate of the sample 1, by placing the substrate of the sample 1 on a substrate electrode in a chamber of a parallel plate type plasma CVD apparatus (not shown), introducing toluene into the chamber at a flow rate of 30 sccm as a raw material gas, setting the pressure in the chamber to be 0.5 Pa, keeping the substrate temperature at room temperature (substrate was not heated), supplying radio frequency waves of 13.56 MHz to the substrate electrode at an output of 900 W, and forming a film in prescribed film-forming time.

[Method for Forming DLC Film of Sample 2]

A 10 nm-thick DLC film was formed on the Pt electrode thin film 4 of the substrate of the sample 2, by placing the substrate of the sample 2 on a substrate electrode in a chamber of a parallel plate type plasma CVD apparatus (not shown), introducing toluene into the chamber at a flow rate of 30 sccm as a raw material gas, setting the pressure in the chamber to be 0.5 Pa, keeping the substrate temperature at room temperature (substrate was not heated), supplying radio frequency waves of 13.56 MHz to the substrate electrode at an output of 900 W, and forming a film in prescribed film-forming time.

[Method for Forming DLC Film of Sample 3]

A 10 nm-thick DLC film was formed on the Pt electrode thin film 4 of the substrate of the sample 3, by placing the substrate of the sample 3 on a substrate electrode in a chamber of a parallel plate type plasma CVD apparatus (not shown), introducing toluene into the chamber at a flow rate of 30 sccm as a raw material gas, setting the pressure in the chamber to be 0.5 Pa, keeping the substrate temperature at room temperature (substrate was not heated), supplying radio frequency waves of 13.56 MHz to the substrate electrode at an output of 900 W, and forming a film in prescribed film-forming time.

[Method for Forming DLC Film of Sample 4]

A 100 nm-thick DLC film was formed on the Pt electrode thin film 4 of the substrate of the sample 4, by placing the substrate of the sample 4 on a substrate electrode in a chamber of a parallel plate type plasma CVD apparatus (not shown), introducing toluene into the chamber at a flow rate of 30 sccm as a raw material gas, setting the pressure in the chamber to be 0.5 Pa, keeping the substrate temperature at room temperature (substrate was not heated), supplying radio frequency waves of 13.56 MHz to the substrate electrode at an output of 900 W, and forming a film in prescribed film-forming time.

Note that, for the above-described samples 1 to 4, the flow rate of toluene in film forming is set to be 30 sccm, but the flow rate of a raw material gas in film forming may be set to be in a range of 3 to 100 sccm.

Furthermore, for the above-described samples 1 to 4, the pressure in the chamber in film forming is set to be 0.5 Pa, but the pressure in the chamber in film forming may be set to be in a range of 0.1 to 20 Pa.

Moreover, for the above-described samples 1 to 4, the substrate temperature in film forming is set to be room temperature, but the substrate temperature in film forming may be set to be in a range of room temperature to 300° C.

In addition, for the above-described samples 1 to 4, the electric power of output 900 W is supplied to the substrate electrode in film forming, but an electric power in a power density range of 0.01 to 5.00 W/cm$^2$ may be supplied to the substrate electrode in film forming.

Subsequently, on a DLC film that is the carbon film 5 of the substrate of each of samples 1 to 4, a PZT film 6 was formed by a spin coating method. Methods for forming these PZT films 6 are as follows.

As a sol-gel solution for forming a PZT ferroelectric thin film, an E1 solution of 10% by weight concentration in which 20% of lead was added excessively in a solvent of butanol (manufactured by Mitsubishi Materials Corporation) was used. The E1 solution was spin-coated with a spin coater. As the spin coater, for example, MS-A200 (manufactured by MIKASA CO., LTD) was used. First, the coater was rotated at 800 rpm for 5 sec and at 1500 rpm for 10 sec, and, then, the rotation rate was gradually increased to 3000 rpm in 10 sec. After that, it was left on a hot plate (ceramic hot plate AHS-300, manufactured by AS ONE Corporation) at 150° C. for 5 min in the air, left on the hot plate (AHS-300) at 300° C. for min in the air, and then cooled to room temperature. By repetition of the operation five times, a PZT amorphous thin film having an intended thickness was formed.

Next, a thermal oxidation treatment was performed on PZT amorphous thin films of substrates of samples 1 to 4 by using a rapid heating furnace (RTA), to thereby crystallize PZT amorphous thin films. The conditions of the thermal treatment at this time were such that temperature was raised to 700° C. at an increase rate of 100° C./sec, held for 5 min and then cooled, in an $O_2$ 100% atmosphere and a pressurized circumstance of 9.9 atm.

Figure 2:
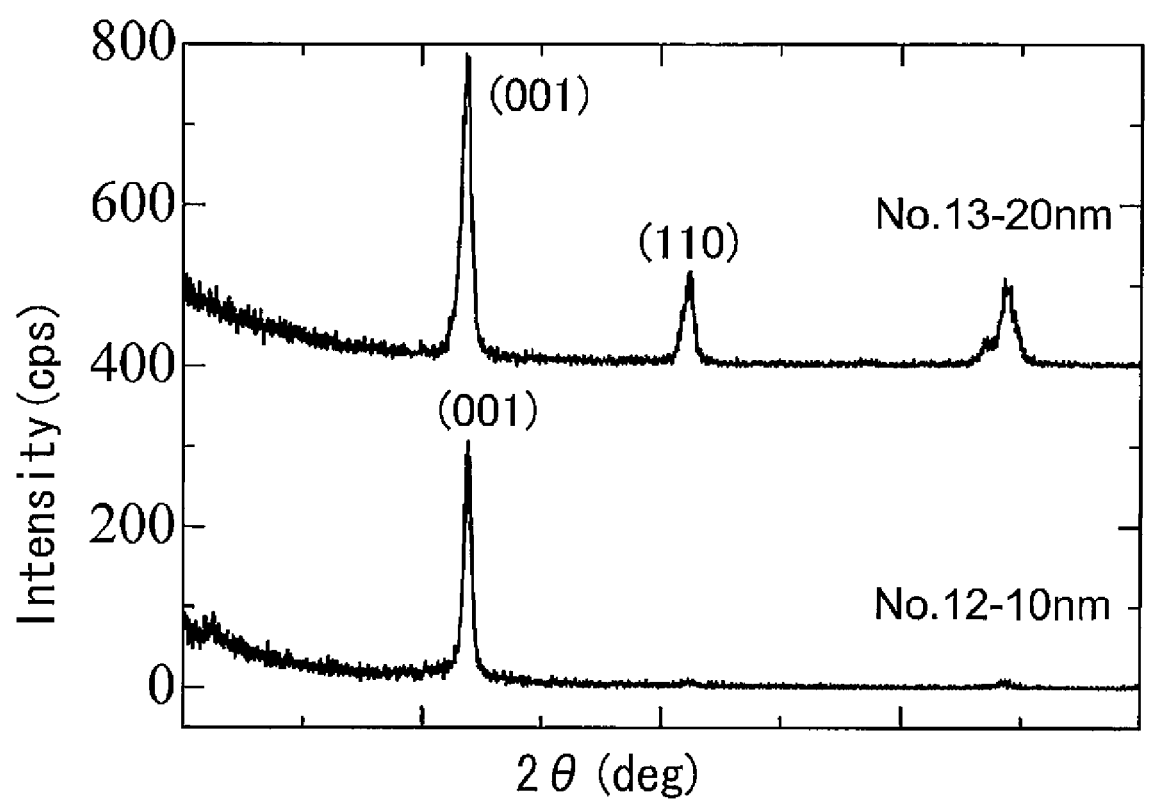
FIG. 2 is a drawing showing XRD patterns of each of samples 1 and 2 in Example 1 measured with a parallel beam optical system.
Figure 3:
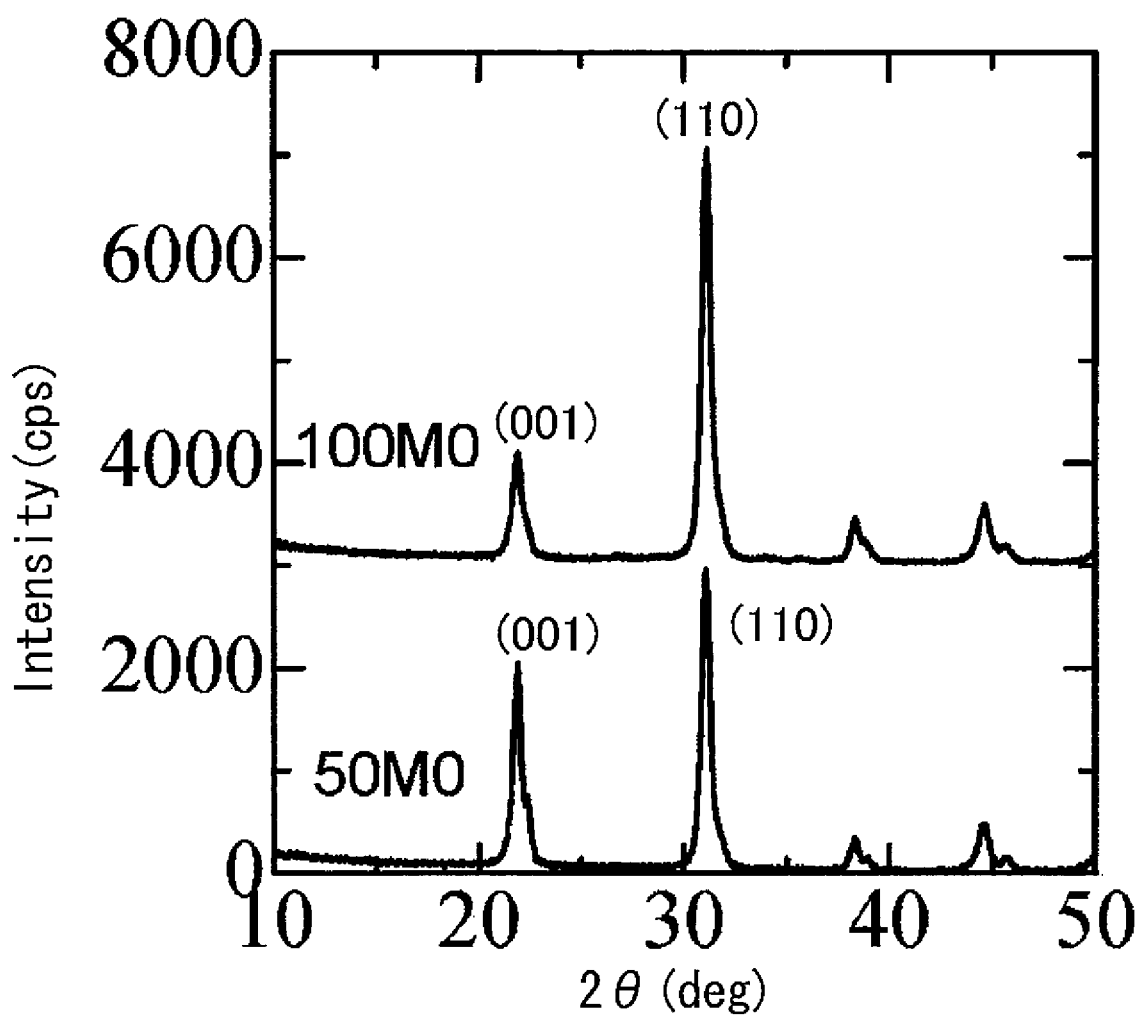
FIG. 3 is a drawing showing XRD patterns of each of samples 3 and 4 in Example 1 measured with a parallel beam optical system.

XRD patterns of the sample 1 (3 μm-PZT/10 nm-DLC/200 nm-Pt/30 nm-TiO$_x$/200 nm-SiO$_2$/Si) and the sample 2 (3 μm-PZT/20 nm-DLC/200 nm-Pt/30 nm-TiO$_x$/200 nm-SiO$_2$/Si) thus obtained, each of which was measured with a parallel beam optical system, are shown in FIG. 2, and XRD patterns of the sample 3 (3 μm-PZT/50 nm-DLC/200 nm-Pt/30 nm-TiO$_x$/200 nm-SiO$_2$/Si) and the sample 4 (3 μm-PZT/100 nm-DLC/200 nm-Pt/30 nm-TiO$_x$/200 nm-SiO$_2$/Si) thus obtained, each of which was measured with a parallel beam optical system, are shown in FIG. 3.

As shown in FIG. 2, the PZT film of the sample 1 (No. 12) exhibited a strong (001) orientation, and the PZT film of the sample 2 (No. 13) exhibited a strong (001) orientation and a weak (110) orientation.

As shown in FIG. 3, the PZT film of the sample 3 (50M0) exhibited a strong (110) orientation and a weak (001) orientation, and the PZT film of the sample 4 (100M0) exhibited a very strong (110) orientation and a weak (001) orientation.

In addition, by using the carbon film 5 such as a DLC film as the burnable material film, all the DLC film burns and changes into $CO_2$ at the same time as the crystallization, that is, oxidation of the PZT film 6. Therefore, large benefits can be obtained in which carbon does not diffuse into the PZT film 6, and in which, as the result, properties of the PZT film 6 are not deteriorated.

Furthermore, the hydrogen amount contained in the DLC film is preferably not less than 1% by weight, more preferably not less than 10% by weight, much more preferably 10 to 80% by weight, and furthermore preferably 30 to 60% by weight.

The carbon film 5 such as the DLC film as a buffer layer may remain or disappear after crystallizing the PZT amorphous thin film, depending on the thickness, film forming conditions and the like thereof. However, when crystallizing the PZT amorphous thin film, by forming the carbon film 5 such as the DLC film as a buffer layer to have a thickness of 0.1 nm to 200 nm, the orientation of the PZT film 6 can be controlled arbitrarily.

Moreover, the (001)-oriented PZT film obtained in the present Example can be applied to electronic components such as an actuator and MEMS, the (111)-oriented PZT film can be applied to an electronic component such as FRAM (registered trademark), and the (110)-oriented PZT film can be applied to an electronic component such as a SAW device.

Example 2

Three substrates for producing samples 1 to 3 were prepared. As the substrate, there was used one having a 300 nm-thick SiO$_2$ film formed on a 6-inch Si (100) substrate, having formed a 5 nm-thick TiO$_x$ film formed on the SiO$_2$ film and having a (111)-oriented 150 nm-thick Pt electrode thin film formed on the TiO$_x$ film.

Subsequently, on the Pt electrode thin film of the substrate of the sample 1, an 8 nm-thick DLC film as the burnable material film was formed. Furthermore, on the Pt electrode thin film of the substrate of the sample 2, a 100 nm-thick DLC film as the burnable material film was formed. Moreover, on the Pt electrode thin film of the substrate of the sample 3, a 300 nm-thick DLC film as the burnable material film was formed. These DLC films contain hydrogen. The method for forming these DLC films is the same as that in Example 1.

Subsequently, on each of DLC films of substrates of samples 1 to 3, a PZT film was formed by a spin coating method. The method for forming these PZT films is as follows.

As a sol-gel solution for forming the PZT ferroelectric thin film, there was used a solution in which a main solvent was ethanol, a composition ratio (molar ratio) of a preparation was Pb:Zr:Ti=120:30:70 and concentration of the preparation in terms of oxides was 25% by weight. The solution was spin-coated with a spin coater. As the spin coater, for example, MS-A200 (manufactured by MIKASA CO., LTD) was used. The spin conditions are such that the substrate is rotated at 1500 rpm for 30 sec, and then, rotated at 4000 rpm for 10 sec. After that, the coated film was left on a hot plate (ceramic hot plate AHS-300, manufactured by AS ONE Corporation) at 250° C. for 30 sec in the air, and was subjected to temporary calcination at 500° C. for 60 sec. Therefore, a PZT amorphous thin film having an intended thickness was formed.

Next, a thermal oxidation treatment was performed on PZT amorphous thin films of substrates of samples 1 to 3 by using a rapid heating furnace (RTA), to thereby crystallize PZT amorphous thin films. The conditions of the thermal treatment at this time were such that, for the sample 1, temperature was raised to 700° C. at an increase rate of 100° C./sec, held for 1 min and then cooled, in an $O_2$ 100% atmosphere and an ordinary pressure circumstance of 1 atm, for the sample 2, temperature was raised to 700° C. at an increase rate of 100° C./sec, held for 1 min and then cooled, in an $O_2$ 100% atmosphere and a pressurized circumstance of 5 atm and, for the sample 3, temperature was raised to 700° C. at an increase rate of 100° C./sec, held for 1 min and then cooled, in an $O_2$ 100% atmosphere and a pressurized circumstance of 10 atm. The PZT film thus formed had a composition of $Pb(Zr_{0.3}Ti_{0.7})O_3$.

Figure 4:
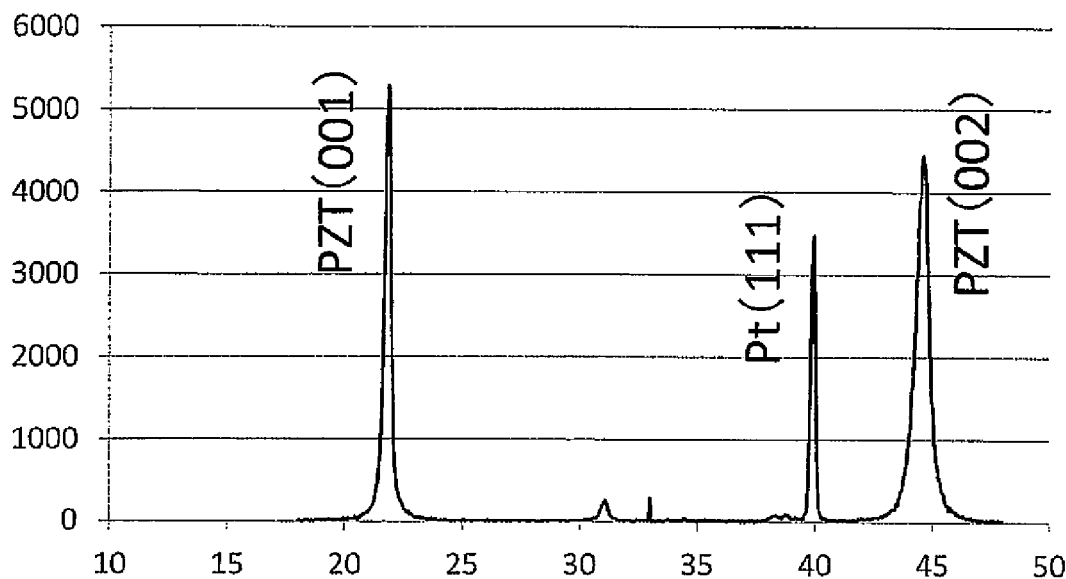
FIG. 4 is a drawing showing an XRD pattern obtained by measuring a sample 1 in Example 2.
Figure 5:
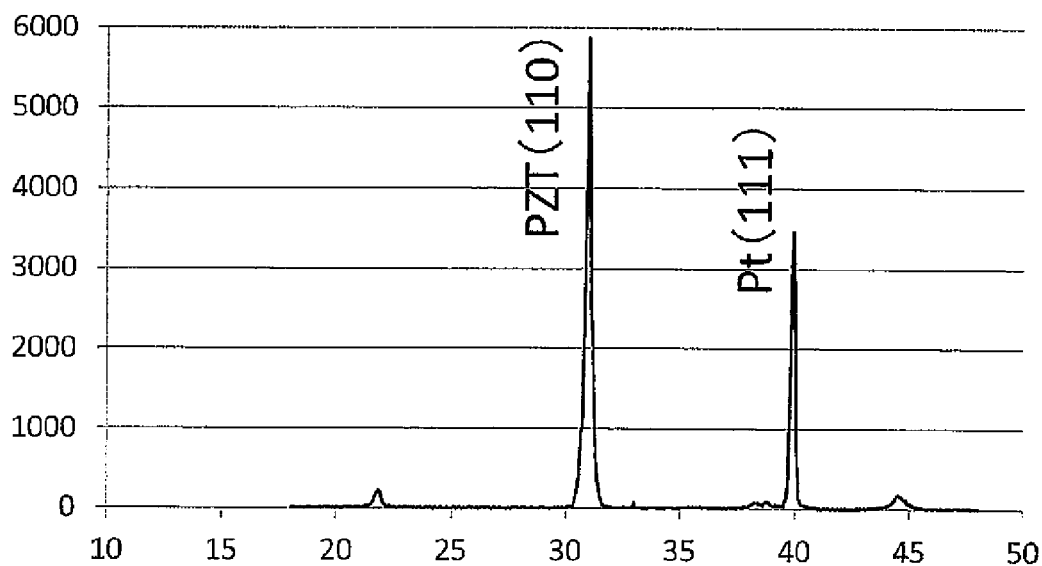
FIG. 5 is a drawing showing an XRD pattern obtained by measuring a sample 2 in Example 2.
Figure 6:
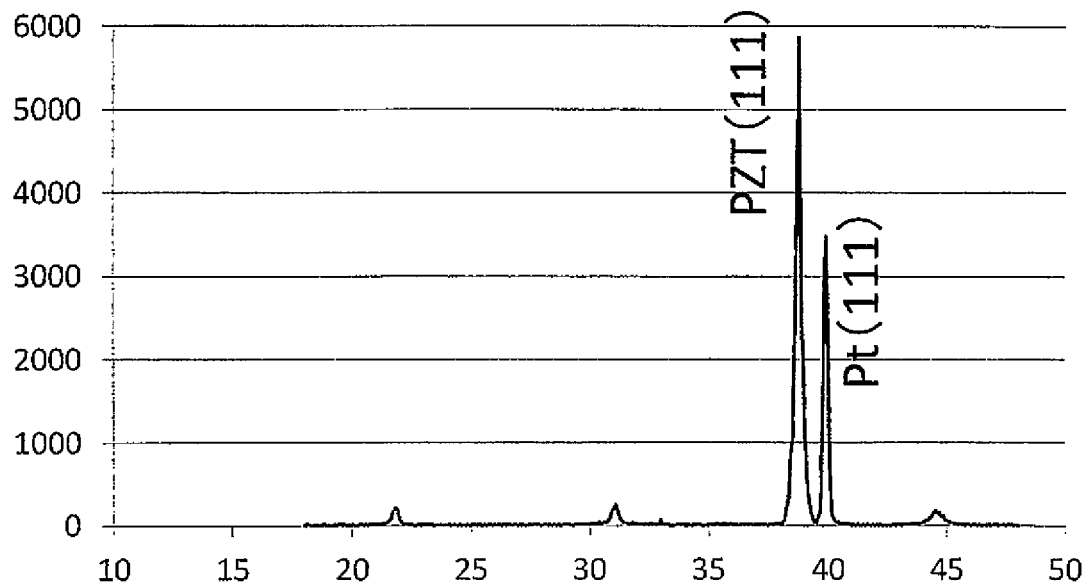
FIG. 6 is a drawing showing an XRD pattern obtained by measuring a sample 3 in Example 2.

An XRD pattern by measuring the sample 1 thus obtained is shown in FIG. 4, an XRD pattern by measuring the sample 2 is shown in FIG. 5, and an XRD pattern by measuring the sample 3 is shown in FIG. 6. In FIGS. 4 to 6, the vertical axis shows an XRD reflection intensity and the horizontal axis shows a rotation angle 2θ.

As shown in FIG. 4, the PZT film of the sample 1 exhibited a strong (001) orientation, as shown in FIG. 5, the PZT film of the sample 2 exhibited a strong (110) orientation, and, as shown in FIG. 6, the PZT film of the sample 3 exhibited a strong (111) orientation.

As shown in FIGS. 4 to 6, by increasing the oxygen partial pressure in the crystallization by 1 atm, 5 atm and atm, the orientation of the PZT film can be controlled to be (001), (110) and (111).

Example 3

On each of the PZT films of samples 1 to 3 in Example 2, a thick PZT film was formed by a spin coating method. A method for forming these thick PZT films is as follows.

As a sol-gel solution for forming the PZT ferroelectric thin film, there was used a solution in which a main solvent was ethanol, a composition ratio (molar ratio) of a preparation was Pb:Zr:Ti=120:52:48 and concentration of the preparation in terms of oxides was 25% by weight. The solution was spin-coated with a spin coater. As the spin coater, for example, MS-A200 (manufactured by MIKASA CO., LTD) was used.

The spin conditions are such that the substrate is rotated at 1500 rpm for 30 sec, and then, rotated at 4000 rpm for 10 sec. After that, the coated film was left on a hot plate (ceramic hot plate AHS-300, manufactured by AS ONE Corporation) at 250° C. for 30 sec in the air, and was subjected to temporary calcination at 500° C. for 60 sec. Then, the above-mentioned spin coating, drying and temporary calcination were performed continuously 25 times. Consequently, a thick PZT amorphous film was formed.

Next, a thermal oxidation treatment was performed on PZT amorphous thick films of the substrates of the samples 1 to 3 by using a rapid heating furnace (RTA), to thereby crystallize PZT amorphous thick films. The conditions of the thermal treatment at this time were such that, for the sample 1, temperature was raised to 700° C. at an increase rate of 100° C./sec, held for 1 min and then cooled, in an $O_2$ 100% atmosphere and an ordinary pressure circumstance of 1 atm, for the sample 2, temperature was raised to 700° C. at an increase rate of 100° C./sec, held for 1 min and then cooled, in an $O_2$ 100% atmosphere and a pressurized circumstance of 5 atm and, for the sample 3, temperature was raised to 700° C. at an increase rate of 100° C./sec, held for 1 min and then cooled, in an $O_2$ 100% atmosphere and a pressurized circumstance of 10 atm.

Next, samples 1 to 3 were subjected to a post-annealing treatment. The conditions at this time were such that temperature was raised to 800° C. at an increase rate of 100° C./sec, held for 10 min and then cooled, in an $O_2$ 100% atmosphere and a pressurized circumstance of 10 atm. The PZT thick film thus produced had a thickness of 4.5 μm and a composition of Pb $(Zr_{0.52}Ti_{0.48})O_3$. 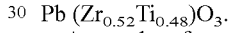

As results of measuring XRD patterns of samples 1 to 3 thus obtained, the PZT thick film of the sample 1 exhibited a strong (001) orientation, the PZT thick film of the sample 2 exhibited a strong (110) orientation, and the PZT thick film of the sample 3 exhibited a strong (111) orientation.

As shown in FIGS. 4 to 6, by increasing the oxygen partial pressure in the crystallization by 1 atm, 5 atm and atm, the orientation of the PZT film can be controlled to be (001), (110) and (111).

According to the present example, it was confirmed that, since the PZT film formed under the PZT thick film is used as an initial nucleus, the PZT thick film has the same orientation of the crystalline plane as the PZT film.

Example 4

A substrate for producing sample 1 was prepared. As the substrate, there was used one having a 300 nm-thick $SiO_2$ film formed on a 6-inch Si (100) substrate, having formed a 5 nm-thick $TiO_x$ film formed on the $SiO_2$ film, and having a (111)-oriented 150 nm-thick Pt electrode thin film formed on the $TiO_x$ film.

Subsequently, on the Pt electrode thin film of the substrate of the sample 1, a 10 nm DLC film as the burnable material film was formed. The DLC film contains hydrogen. The method for forming the DLC film is the same as the method in Example 1.

Subsequently, on the DLC film of the substrate of the sample 1, a KNN film composed of a perovskite structure, that is, $(K_{1-x}Na_x)NbO_3$ film ($0.3 \leq X \leq 0.7$) was formed by a spin coating method. The method for forming the KNN film is as follows.

As a sol-gel solution for forming the KNN ferroelectric thin film, there was used a solution in which a main solvent was ethanol, a composition ratio (molar ratio) of a preparation was K:Na:Nb=60:60:100 and concentration of the preparation in terms of oxides was 1 mol/kg. The solution was spin-coated with a spin coater. As the spin coater, for example, MS-A200 (manufactured by MIKASA CO., LTD) was used. The spin conditions are such that the solution is rotated at 1500 rpm for 30 sec, and then, rotated at 4000 rpm for sec. After that, the coated film was left on a hot plate (ceramic hot plate AHS-300, manufactured by AS ONE Corporation) at 250° C. for 30 sec in the air, and was subjected to temporary calcination at 500° C. for 60 sec. Therefore, a KNN amorphous thin film having an intended thickness was formed.

Next, a thermal oxidation treatment was performed on the KNN amorphous thin film of the substrate of the sample 1 by using a rapid heating furnace (RTA), to thereby crystallize the KNN amorphous thin film. The conditions of the thermal treatment at this time were such that temperature was raised to 700° C. at an increase rate of 100° C./sec, held for 1 min and then cooled, in an $O_2$ 100% atmosphere and an ordinary pressure circumstance of 1 atm. The KNN film thus produced had a composition of $(K_{0.5}Na_{0.5})NbO_3$.

Figure 7:
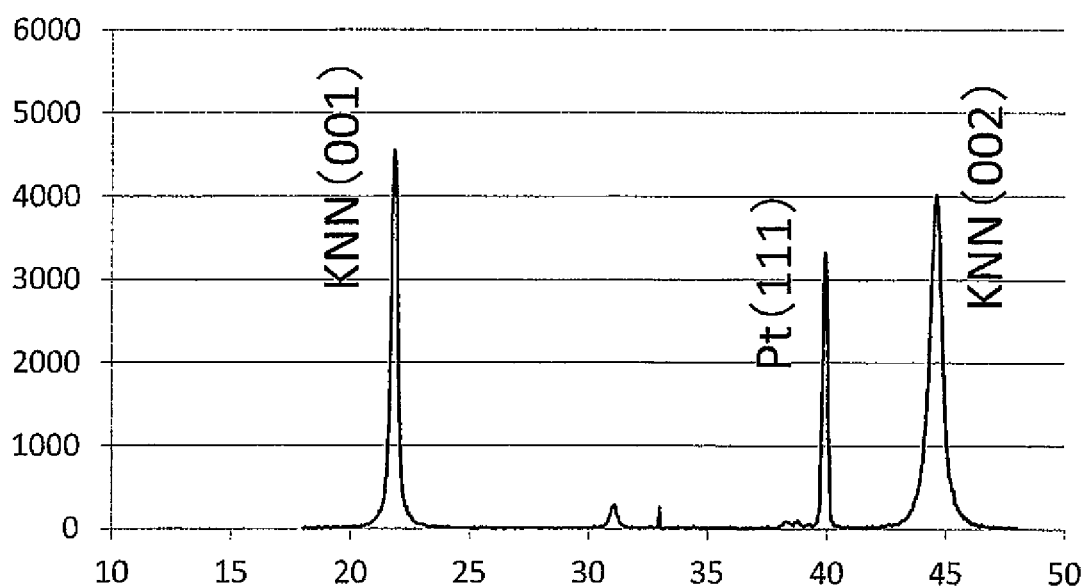
FIG. 7 is a drawing showing an XRD pattern obtained by measuring a sample 1 in Example 4.
Figure 8:
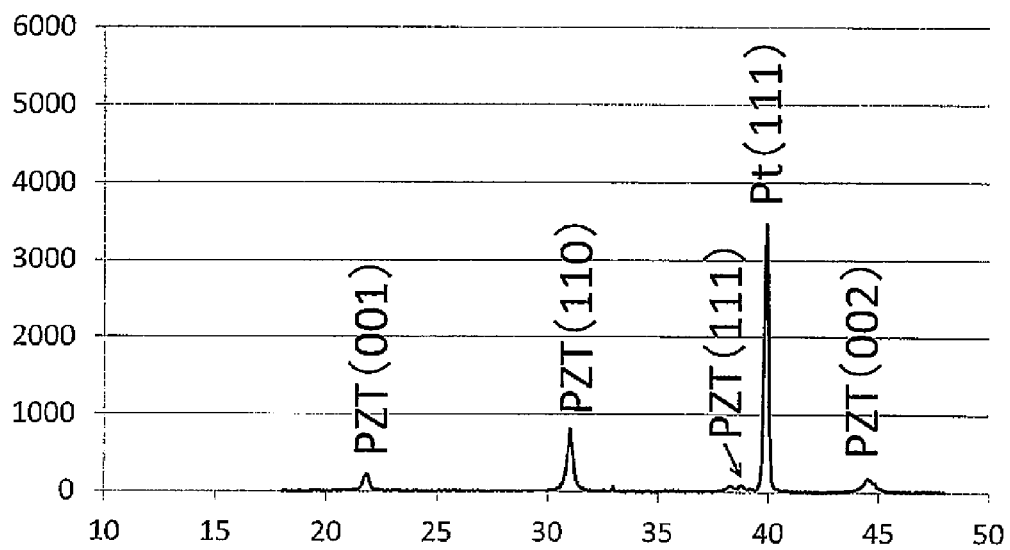
FIG. 8 is a drawing showing an XRD pattern of a conventional PZT film.

An XRD pattern by measuring the sample 1 thus obtained is shown in FIG. 7. In FIG. 7, the vertical axis shows an XRD reflection intensity and the horizontal axis shows a rotation angle 2θ.

As shown in FIG. 7, the KNN film of the sample 1 exhibited a strong (001) orientation.

Ferroelectric films according to Examples 1 to 4 are composed of a perovskite structure oxide, and the half-value width of the strongest peak in measurement results of any of (001), (110) and (111) orientations by X-ray diffraction was not more than 0.30. Note that the half-value width may be not more than 1.50 (more preferably not more than 0.75°, further more preferably not more than 0.4°).

The invention claimed is:

1. A method for manufacturing a ferroelectric film, comprising the steps of:
    forming a burnable material film containing hydrogen of not less than 1% by weight on a substrate;
    forming an amorphous thin film including a ferroelectric material on said burnable material film; and
    oxidizing and crystallizing said amorphous thin film while supplying hydrogen to said amorphous thin film by burning said burnable material film through heating of said burnable material film and said amorphous thin film in an oxygen atmosphere, to thereby form a first ferroelectric film on said substrate, wherein:
    said first ferroelectric film includes a perovskite structure oxide;
    said first ferroelectric film is oriented in any of (001), (001)+(110), (110), (110)+(111), and (111), when said amorphous thin film is heated in an oxygen atmosphere, by increase in an oxygen supply amount, as a pressurized oxygen atmosphere;
    a pressure of the pressurized oxygen atmosphere when said first ferroelectric film is oriented in (001) is lower than a pressure of the pressurized oxygen atmosphere when said first ferroelectric film is oriented in (001)+(110);
    a pressure of the pressurized oxygen atmosphere when said first ferroelectric film is oriented in (001)+(110) is lower than a pressure of the pressurized oxygen atmosphere when said first ferroelectric film is oriented in (110);
    a pressure of the pressurized oxygen atmosphere when said first ferroelectric film is oriented in (110) is lower than a pressure of the pressurized oxygen atmosphere when said first ferroelectric film is oriented in (110)+(111); and
    a pressure of the pressurized oxygen atmosphere when said first ferroelectric film is oriented in (110)+(111) is lower than a pressure of the pressurized oxygen atmosphere when said first ferroelectric film is oriented in (111).

2. The method for manufacturing a ferroelectric film according to claim 1, wherein said burnable material film is a $C_xN_yH_z$ film, a carbon film or a DLC film, and x, y and z satisfy following Formulae (i) and (ii):

$$0.1 \leq z \quad \text{(i)}$$

$$x+y+z=1 \quad \text{(ii).}$$

3. The method for manufacturing a ferroelectric film according to claim 1, wherein
    said first ferroelectric film includes at least one of:
    perovskite or a bismuth layered structure oxide represented by $ABO_3$ or $(Bi_2O_2)^{2+}(A_{m-1}B_mO_{3m+1})^{2-}$ (wherein A is at least one kind selected from the group consisting of Li, Na, K, Rb, Pb, Ca, Sr, Ba, Bi, La and Hf, B is at least one kind selected from the group consisting of Ru, Fe, Ti, Zr, Nb, Ta, V, W and Mo, and m is a natural number of not more than 5;
    a superconductive oxide represented by $LanBa_2Cu_3O_7$, $Trm_2Ba_2Ca_{n-1}Cu_nO_{2n+4}$ or $TrmBa_2Ca_{n-1}Cu_nO_{2+3}$ (wherein Lan is at least one kind selected from the group consisting of Y, La, Ce, Pr, Nd, Pm, Sm, Eu, Gd, Tb, Dy, Ho, Er, Tm, Yb and Lu, Trm is at least one kind selected from the group consisting of Bi, Tl and Hg, and n is a natural number of not more than 5;
    a tungsten bronze structure oxide represented by $A_{0.5}BO_3$ (tetragonal bronze structure) or $A_{0.3}BO_3$ (hexagonal bronze structure) (wherein A is at least one kind selected from the group consisting of Li, Na, K, Rb, Cs, Pb, Ca, Sr, Ba, Bi and La, and B is at least one kind selected from the group consisting of Ru, Fe, Ti, Zr, Nb, Ta, V, W and Mo;
    a material of at least one kind selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$;
    a material including $SiO_2$ in the at least one kind of material; and
    a material including $SiO_2$ and $GeO_2$ in the at least one kind of material.

4. The method for manufacturing a ferroelectric film according to claim 1, wherein:
    said first ferroelectric film includes a perovskite structure oxide; and
    said first ferroelectric film is oriented in any of (001), (001)+(110), (110), (110)+(111) and (111) by increasing a thickness of said burnable material film.

5. The method for manufacturing a ferroelectric film according to claim 4, wherein:
    a thickness of said burnable material film when said first ferroelectric film is oriented in (001) is smaller than a thickness of said burnable material film when said first ferroelectric film is oriented in (001)+(110);
    a thickness of said burnable material film when said first ferroelectric film is oriented in (001)+(110) is smaller than a thickness of said burnable material film when said first ferroelectric film is oriented in (110);
    a thickness of said burnable material film when said first ferroelectric film is oriented in (110) is smaller than a thickness of said burnable material film when said first ferroelectric film is oriented in (110)+(111); and
    a thickness of said burnable material film when said first ferroelectric film is oriented in (110)+(111) is smaller than a thickness of said burnable material film when said first ferroelectric film is oriented in (111).

6. The method for manufacturing a ferroelectric film according to claim 4, wherein
said burnable material film is a DLC film having a thickness of 0.1 nm to 300 nm.

7. The method for manufacturing a ferroelectric film according to claim 1, wherein
said first ferroelectric film is a PZT film.

8. The method for manufacturing a ferroelectric film according to claim 1, wherein:
an electrode is formed on said substrate; and
said first ferroelectric film is formed on said electrode.

9. The method for manufacturing a ferroelectric film according to claim 1, wherein
a thickness of said amorphous thin film is 5 nm to 450 nm.

10. The method for manufacturing a ferroelectric film according to claim 1, furthermore comprising, after the step of forming said first ferroelectric film on a substrate, the step of forming an amorphous thin film including a ferroelectric material on said first ferroelectric film, and oxidizing and crystallizing said amorphous thin film by heating said amorphous thin film in an oxygen atmosphere, to thereby form a second ferroelectric film on said first ferroelectric film.

11. A ferroelectric film manufactured by the method for manufacturing a ferroelectric film according to claim 1,
wherein the ferroelectric film comprises a perovskite structure oxide, and wherein
a half-value width of the strongest peak in measurement results of any of (001), (110) and (111) orientations by X-ray diffraction is not more than 1.5°.

12. The method for manufacturing a ferroelectric film according to claim 1, wherein
said first ferroelectric film includes at least one of:
perovskite or a bismuth layered structure oxide represented by $ABO_3$ or $(Bi_2O_2)^{2+}(A_{m-1}B_mO_{3m+1})^{2-}$, wherein A is at least one kind selected from the group consisting of Li, Na, K, Rb, Pb, Ca, Sr, Ba, Bi, La and Hf, B is at least one kind selected from the group consisting of Ru, Fe, Ti, Zr, Nb, Ta, V, W and Mo, and m is a natural number of not more than 5;
a superconductive oxide represented by $LanBa_2Cu_3O_7$, $Trm_2Ba_2Ca_{n-1}Cu_nO_{2n+4}$ or $TrmBa_2Ca_{n-1}Cu_nO_{2n+3}$, wherein Lan is at least one kind selected from the group consisting of Y, La, Ce, Pr, Nd, Pm, Sm, Eu, Gd, Tb, Dy, Ho, Er, Tm, Yb and Lu, Trm is at least one kind selected from the group consisting of Bi, Tl and Hg, and n is a natural number of not more than 5;
a tungsten bronze structure oxide represented by $A_{0.5}BO_3$ (tetragonal bronze structure) or $A_{0.3}BO_3$ (hexagonal bronze structure), wherein A is at least one kind selected from the group consisting of Li, Na, K, Rb, Cs, Pb, Ca, Sr, Ba, Bi and La, and B is at least one kind selected from the group consisting of Ru, Fe, Ti, Zr, Nb, Ta, V, W and Mo;
a material of at least one kind selected from the group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$ and $V_2O_5$;
a material including $SiO_2$ in the at least one kind of material; and
a material including $SiO_2$ and $GeO_2$ in the at least one kind of material.

13. A method for manufacturing a ferroelectric film, comprising the steps of:
forming, on a substrate, an amorphous thin film including a burnable material containing hydrogen of not less than 1% by weight and a ferroelectric material; and
oxidizing and crystallizing said amorphous thin film while supplying hydrogen to said amorphous thin film by burning said burnable material through heating of said amorphous thin film in an oxygen atmosphere, to thereby form a first ferroelectric film on said substrate, wherein:
said first ferroelectric film includes a perovskite structure oxide;
said first ferroelectric film is oriented in any of (001), (001)+(110), (110), (110)+(111), and (111), when said amorphous thin film is heated in an oxygen atmosphere, by increase in an oxygen supply amount, as a pressurized oxygen atmosphere;
a pressure of the pressurized oxygen atmosphere when said first ferroelectric film is oriented in (001) is lower than a pressure of the pressurized oxygen atmosphere when said first ferroelectric film is oriented in (001)+(110);
a pressure of the pressurized oxygen atmosphere when said first ferroelectric film is oriented in (001)+(110) is lower than a pressure of the pressurized oxygen atmosphere when said first ferroelectric film is oriented in (110);
a pressure of the pressurized oxygen atmosphere when said first ferroelectric film is oriented in (110) is lower than a pressure of the pressurized oxygen atmosphere when said first ferroelectric film is oriented in (110)+(111); and
a pressure of the pressurized oxygen atmosphere when said first ferroelectric film is oriented in (110)+(111) is lower than a pressure of the pressurized oxygen atmosphere when said first ferroelectric film is oriented in (111).

14. The method for manufacturing a ferroelectric film according to claim 13, wherein said burnable material is a carbon powder that supports hydrogen.

15. The method for manufacturing a ferroelectric film according to claim 13, wherein
said first ferroelectric film is a PZT film.

16. The method for manufacturing a ferroelectric film according to claim 13, wherein:
an electrode is formed on said substrate; and
said first ferroelectric film is formed on said electrode.

17. The method for manufacturing a ferroelectric film according to claim 13, wherein
a thickness of said amorphous thin film is 5 nm to 450 nm.

18. The method for manufacturing a ferroelectric film according to claim 13, furthermore comprising, after the step of forming said first ferroelectric film on a substrate, the step of forming an amorphous thin film including a ferroelectric material on said first ferroelectric film, and oxidizing and crystallizing said amorphous thin film by heating said amorphous thin film in an oxygen atmosphere, to thereby form a second ferroelectric film on said first ferroelectric film.

19. A ferroelectric film manufactured by the method for manufacturing a ferroelectric film according to claim 13,
wherein the ferroelectric film comprises a perovskite structure oxide, and wherein a half-value width of the strongest peak in measurement results of any of (001), (110) and (111) orientations by X-ray diffraction is not more than 1.5.

20. A ferroelectric film comprising a perovskite structure oxide, wherein
a half-value width of the strongest peak in measurement results of any of (001), (110) and (111) orientations by X-ray diffraction is not more than 1.5°.

21. An electronic component using said ferroelectric film according to claim 20.

* * * * *